United States Patent
Flanders et al.

(10) Patent No.: US 7,450,862 B2
(45) Date of Patent: Nov. 11, 2008

(54) STRAY LIGHT INSENSITIVE DETECTOR SYSTEM AND AMPLIFIER

(75) Inventors: Dale C. Flanders, Lexington, MA (US); Walid Atia, Lexington, MA (US); Eric E. Fitch, Medford, MA (US); Minh Van Le, Methuen, MA (US); Randal A. Murdza, North Andover, MA (US); Robert L. Payer, Pepperell, MA (US); Jeffrey A. Korn, Lexington, MA (US); Xiaomei Wang, Winchester, MA (US); Walter R. Buchwald, Hampstead, NH (US); L. James Newman, III, Sudbury, MA (US)

(73) Assignee: Axsun Technologies, Inc., Billerica, MA (US)

( * ) Notice: Subject to any disclaimer, the term of this patent is extended or adjusted under 35 U.S.C. 154(b) by 404 days.

(21) Appl. No.: 10/392,353

(22) Filed: Mar. 19, 2003

(65) Prior Publication Data

US 2004/0100686 A1 May 27, 2004

Related U.S. Application Data

(60) Provisional application No. 60/319,151, filed on Mar. 19, 2002, provisional application No. 60/365,583, filed on Mar. 19, 2002.

(51) Int. Cl.
  *H04B 10/06* (2006.01)
(52) U.S. Cl. .................. 398/202; 398/212

(58) Field of Classification Search .......... 398/202, 398/207; 257/431, 433
See application file for complete search history.

(56) References Cited

U.S. PATENT DOCUMENTS

| 4,446,372 | A | * | 5/1984 | Gurnee | 257/E27.129 |
|---|---|---|---|---|---|
| 4,687,329 | A | * | 8/1987 | Schultz | 356/328 |
| 5,302,778 | A | * | 4/1994 | Maurinus | 257/432 |
| 5,627,931 | A | * | 5/1997 | Ackley et al. | 385/88 |
| 5,834,778 | A | * | 11/1998 | Veyrier et al. | 250/352 |
| 6,075,237 | A | * | 6/2000 | Ciccarelli | 257/435 |
| 6,827,503 | B2 | * | 12/2004 | Steinberg et al. | 385/92 |
| 2003/0094688 | A1 | * | 5/2003 | Dharia et al. | 257/701 |

* cited by examiner

*Primary Examiner*—Shi K Li
(74) *Attorney, Agent, or Firm*—Houston Eliseeva, LLP

(57) ABSTRACT

A detector system for a fiber optic component is insensitive to stray light. Specifically, the invention comprises a detector chip, which converts received light into an electric signal. A baffle substrate is positioned over the detector chip. This baffle substrate has a transmission port through which an optical signal is transmitted to the detector chip. As a result, light that is not directed to be transmitted through the port is blocked by the baffle substrate. In this way, it rejects stray light that may be present in the hermetic package. A detector substrate is provided on which the detector chip is mounted. This detector substrate preferably comprises electrical traces to which the detector chip is electrically connected. The detector substrate can further comprise bond pads for wire bonding to make electrical connections to the electrical traces.

8 Claims, 3 Drawing Sheets

STRAY LIGHT INSENSITIVE DETECTOR SYSTEM AND AMPLIFIER

BACKGROUND OF THE INVENTION

Monitoring detectors are used in many fiber-optic components. For example, detectors are typically located in diode laser modules to detect light from the front or rear facets in order to monitor the diode laser's output. They can also be used in fiber amplification systems to detect the optical signals before and after amplification. In still another example, they can be used in monitoring systems to detect the light transmitted through a tunable filter.

Presently, hybrid-integrated optical systems are being manufactured that offer higher levels of integration. For example, in one example, a reference source, tunable filter, and detectors are located in a single hermetic package. In another example, two-stage amplifier modules have been designed. In both of these examples, multiple optical signals are being handled within the same hermetic package.

SUMMARY OF THE INVENTION

One problem that arises when handling multiple optical signals in the same package concerns stray light. For example, in the case of optical performance monitoring system, the detector is located within the hermetic package in order to detect the light that is filtered by the tunable filter. The stray light, however, may be present in the module from the reference source or light that is rejected by the tunable filter as being outside its current passband. This stray light can have the effect of increasing the noise floor of the system or otherwise impairing detection of the signal of interest since it can also be detected by the detector after reflections within the package. In the case of an amplifier system, it can be difficult to detect the input signal, especially before amplification when there may be light in the hermetic package, such as stray pump light.

The present invention is directed to a detector system for a fiber optic component. It is insensitive to stray light. Specifically, the invention comprises a detector chip, which converts received light into an electric signal. A baffle substrate is positioned over the detector chip. This baffle substrate has a transmission port through which an optical signal is transmitted to the detector chip. As a result, light that is not directed to be transmitted through the port is blocked by the baffle substrate. In this way, it rejects stray light that may be present in the hermetic package.

According to the present embodiment, a detector substrate is provided on which the detector chip is mounted. This detector substrate preferably comprises electrical traces to which the detector chip is electrically connected. The detector substrate can further comprise bond pads for wire bonding to make electrical connections to the electrical traces.

According to more details of the preferred embodiment, a spacer may be provided between the detector substrate and the baffle substrate to space the baffle substrate away from the detector chip.

The present baffle substrate comprises a light blocking coating at least on one side of the substrate and outside of the transmission port. Preferably, the baffle substrate comprises light blocking coatings on both the frontside and backside. In the case of an amplifier, where the pump light may be spectrally separated from the optical signal, the baffle substrate can be made absorbing, nontransmissive, and/or reflective at the wavelength of the stray light from the pump source, e.g., 980 or 1480 nanometers (nm). In contrast, if seeking to detector pump light, the baffle substrate can be made absorbing, nontransmissive, and/or reflective at the wavelength of the signal light e.g., about 1500-1600 nm.

In general, according to another aspect, the invention features a two-stage amplifier module. The module comprises an optical bench. An input fiber for transmitting input optical signals to be amplified is secured to the optical bench. An output fiber transmitting an amplified optical signal is similarly secured to the optical bench.

A pump beam combiner combines pump light into the beam of the input optical signal. An amplifier input port is provided, into which the input optical signal and the pump light are transmitted. For example, this amplifier input port is the endface of a length of erbium-doped fiber, in one embodiment. In another example, it can be the input facet to an erbium-doped planar waveguide chip.

Input isolator is further provided on the optical bench for preventing transmission of light into the input fiber. An input detector is located on the optical bench for detecting a portion of the input optical signal.

An output detector on the optical bench detects a portion of the amplified optical signal. At an amplifier output port, the gain medium provides the amplified optical signal. An output isolator prevents transmission into the output port from the output fiber. In an example, this output port could be the other end of the erbium-doped fiber or a facet of the planar waveguide chip.

In this way, the present invention provides a fully integrated two-stage module for an amplifier system. In the present invention, the length and width are both less than 2.5 centimeters, with a height of less than 5 millimeters. The entire amplifier system can be integrated into a package that is less than 50 mm×70 mm×7 mm, when using erbium-doped fiber, for example.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

Figure 1:
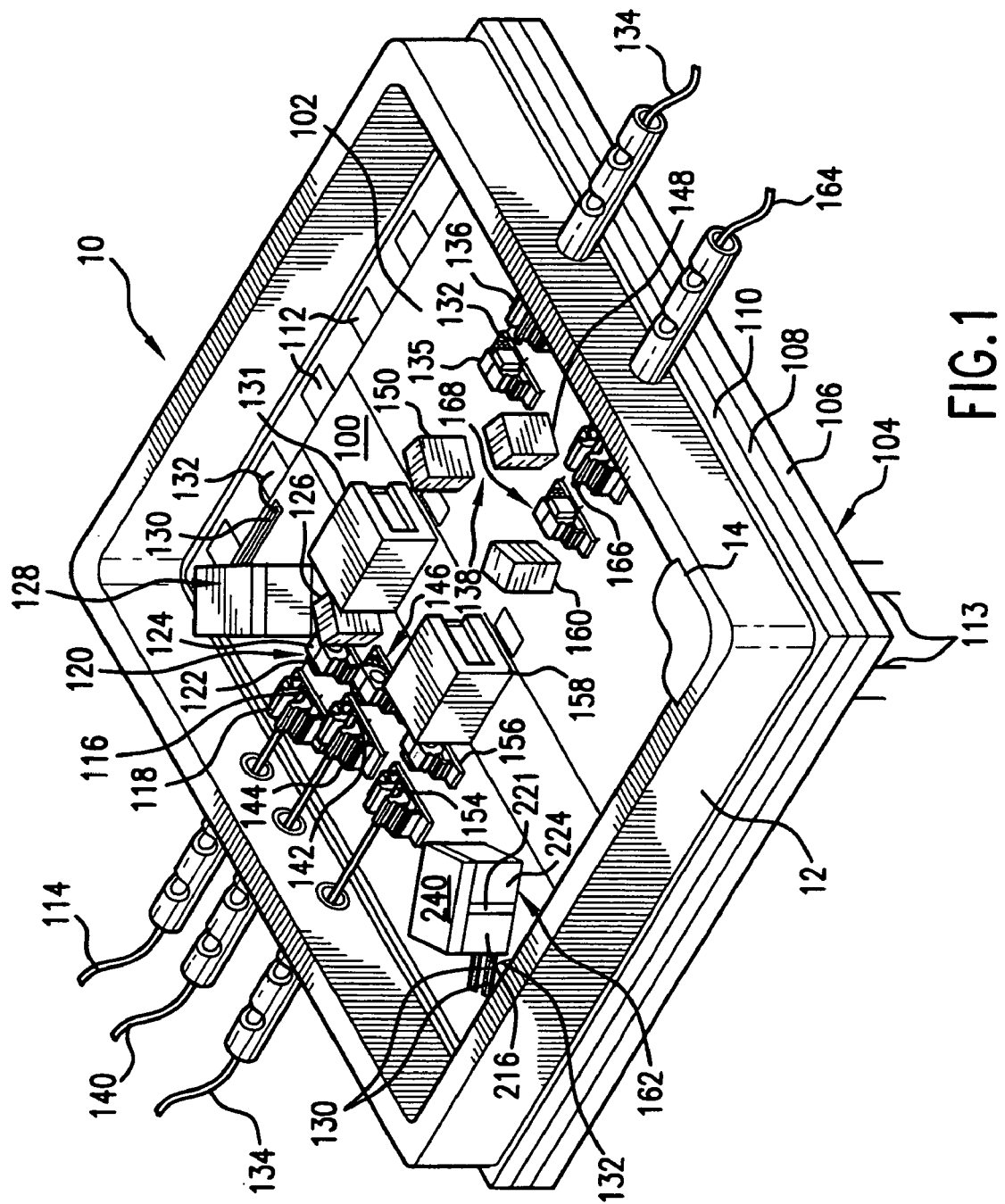
FIG. 1 is a perspective view of a two stage amplifier module according to the present invention.

FIG. 1 shows a two-stage amplifier module 10, which has been constructed according to the principles of the present invention.

The module 10 comprises an optical bench 100. In the present invention, the optical bench 100 is fabricated from aluminum nitride. It has a metal coating 102 to function as an adhesion layer. In the present invention, the adhesion metal includes gold.

The optical bench 100 is attached to a module base 104. Presently, this base 104 is fabricated from a multi-layer silica composite substrate. Specifically, the base comprises a lower layer 106, an intermediate layer 108, and a top layer 110. The top layer 110 of the base 104 is the layer to which the bench 100 is bonded.

Wire bond pads 112 are deposited on the top layer 110 of the base 104. Wire jumpers 132 are provided between these bond pads or wire bonding areas 112 and the active components installed on the bench 100 or metal bench traces 130 formed in the metal layer 102. The middle and bottom layers 108 and 106 of the base 104 preferably comprise electrical base traces connected to these bond pads 112 to provide signal routing typically to ball bump locations or pins 113 on the bottom of the base 104.

An annular sidewall 12 is bonded to the top layer 110 of the module base 104. This acts as a stand off for the lid 14, which is shown cut-away. Thus, the module 10 provides an entirely hermetic seal for optical components that are installed on the bench 100.

An input fiber 114 provides an input optical signal that is to be amplified by the amplifier module 10. This input fiber is secured to the optical bench so that the input fiber's endface 116 is held in a rigid relationship to the bench 100. In the present invention, a deformable mounting structure 118 is used to secure the input fiber 114 to the bench 100.

An input fiber lens component 120 is used to form a beam from the input optical signal that is emitted through the endface 116 of the input fiber 114.

As is the case with other lens components used in the amplifier module 10, the input fiber lens component 120 comprises a lens substrate 122, which is attached to a deformable mounting structure 124 typically by thermocompression or solder bonding. The mounting structure, which is then preferably solder bonded to the bench 100, holds the substrate 122 in a fixed position above the bench 100, while allowing for post installation alignment and tuning that optimizes the performance of the optical train.

An input beam splitter 126 reflects a portion of the input optical signal to an input detector system 128. The resulting electrical signal is provided on bench trace 130. A wire jumper 132 electrically connects the bench trace 130 to one of the wire bond pads 112 of the module base 104.

The remaining beam of the input optical signal is transmitted through an input isolator 131. This input isolator 131 prevents signal propagation into the input fiber 114. The beam exits from the input isolator 131 and is then coupled into amplifier input port 132 by an amplifier input port lens component 135. As described previously, this lens component 135 comprises a deformable mounting structure and a lens substrate.

In the present example, the amplifier input port 132 comprises the endface of an erbium-doped fiber 134. In the present example, the endface of fiber 134 is secured to the bench 100 by a deformable mounting-structure 136. In another implementation, this input port comprises an input facet of an erbium-doped planar waveguide chip.

A pump beam combiner 138 combines pump light into the beam of the input optical signal and further be coupled into the erbium-doped fiber 134. Specifically, in the illustrated embodiment, a pump pigtail 140 conveys the pump light to the module 10. Specifically, an endface 142 of the pigtail 140 is secured to the optical bench 100 by a mounting structure 144. In another example a pump diode chip on a carrier is bonded directing to the bench. The beam exiting from the endface 142 or pump output facet is converted to a beam by pump lens component 146, which comprises a lens substrate in a deformable mounting structure. A fold mirror 148 reflects the pump beam to a filter 150. This filter 150 is transmissive to the wavelength of the input optical signal, but reflective to the wavelength of the pump light. Thus, the light is combined with the beam of the input optical signal.

The other end of the erbium-doped fiber is secured to the module to provide an amplifier output port 154. Specifically, this amplifier output port 154 comprises the endface of the erbium-doped fiber 134. In an alternative example, it could comprise the output facet of an erbium doped planar waveguide.

The light emitted from the amplifier output port 154 is converted into a beam by amplifier output lens component 156. In the illustrated example, this component comprises a lens substrate and a deformable mounting structure.

The beam propagates through an output isolator 158. A beam splitter 160 reflects a portion of the amplified optical signal to an output detector system 162. Electrical connections are made to the detector system 162 by the traces 130 on the bench 100 in the preferred embodiment. The remainder of the amplified optical signal is coupled into the output fiber 164 through the output fiber's endface 166. Coupling is performed by an output fiber lens component 168, which comprises a lens substrate in a deformable mounting structure.

Figure 2:
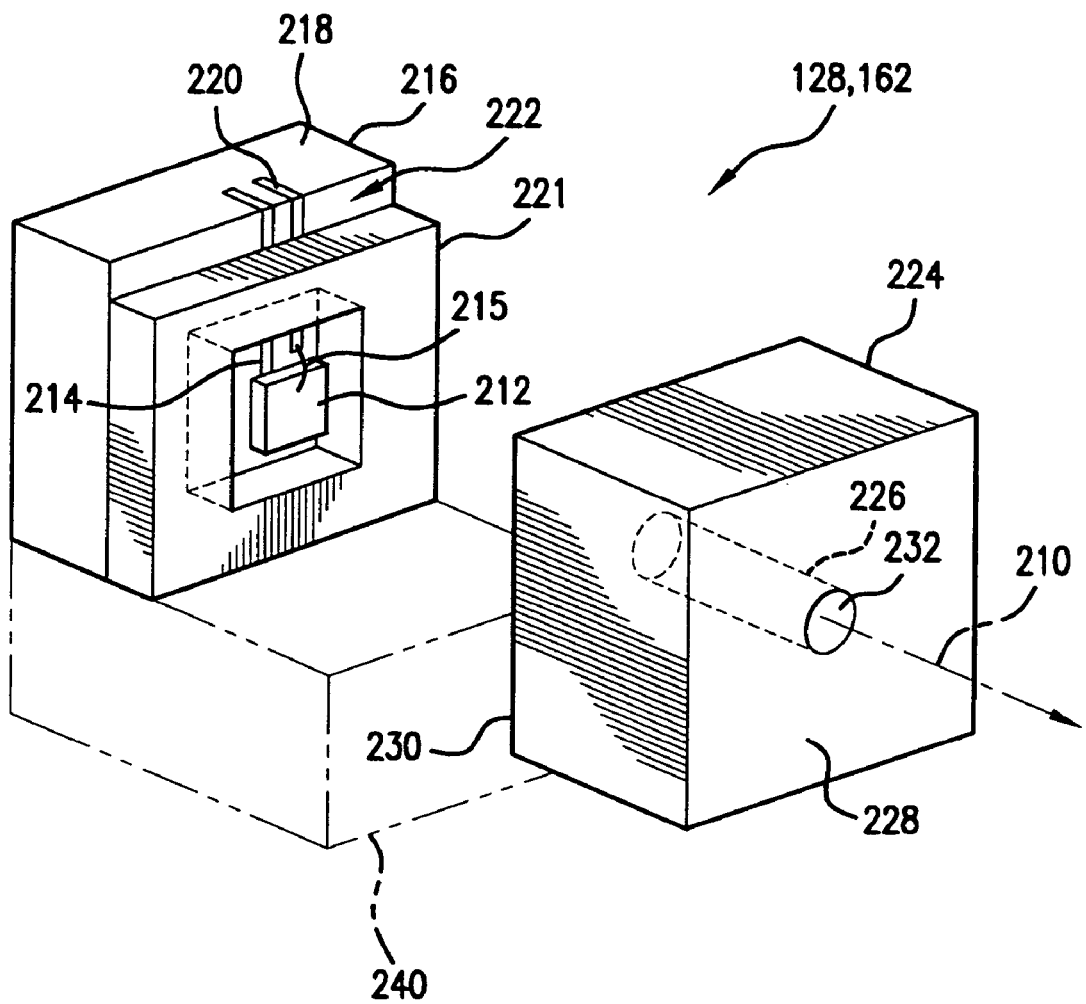
FIG. 2 is a perspective view of a detector system that is insensitive to stray light according to the present invention.

FIG. 2 is an exploded view of the detector systems 128, 162. This detector system is insensitive to stray light. Specifically, only light that is transmitted along an optical axis 210 will be detected by the detector system. Specifically, the light must be parallel and coincident to the axis 210 due to the use of a collimation filter.

In more detail, the detector system comprises a detector chip 212. Typically, this is some type of diode. The backside of the diode is connected to trace 214 that deposited on a detector substrate 216. The chip 212 is also bonded to this detector substrate 216.

A second trace 220 on the detector substrate 216 terminates near the chip 212. A wire jumper 215 makes an electrical connection between the front side of the chip 212 and the second trace 220.

In the preferred embodiment, the traces 214, 220 extend from front face 222 to top surface 218 of the substrate 216. As a result, in one example, the traces 220 and 214 can end in wire bond locations so that wire jumpers make electrical connected between the traces on surface 218 of the detector substrate 216 to wire bond locations in the module. In the preferred embodiment, the detector system 128, 162 shown in FIG. 2 is flipped and bonded directly down onto the bench 100 as shown in FIG. 1. This makes electrical connections between the bench traces 130 and the traces 214, 220 of the detector system. This allows direct routing of the signals on the bench 100, as shown.

Returning to the specifics of FIG. 2, a spacer 221 is provided on the front face 222 of the detector substrate 216. This spacer 221 separates a baffle substrate 224 away from the detector chip 212 while connecting the baffle substrate 224 to the detector substrate 216.

The baffle substrate comprises a transmission port 226 that extends along the optical axis 210 of the detector system to allow collimated light propagating along the optical axis 210 to reach the detector chip 212.

In one example, this transmission port 226 is a hole through the baffle substrate 224, which is otherwise non transmissive to light of the wavelengths that are present in the module 10.

In one implementation, this baffle substrate is fabricated from a metal, specifically COVAR.

In another example, the baffle substrate 224 is transmissive to the signal of interest, and the transmission port 210 is a transmissive portion of the baffle substrate 224.

In one example, when used in an amplifier module, the baffle substrate 224 is fabricated from silicon or a doped ceramic. Silicon has a low transmissivity for wavelengths around 980 nm, the pump wavelength, but is highly transmissive to optical signals around 1550 nm, the optical signal wavelength. As a result, in this example, the baffle substrate itself provides some discrimination to allow the selective detection of the optical signals in the presence of pump light.

In the present preferred embodiment, the baffle substrate has a light blocking coating 228 in the region of the substrate surrounding the transmission port 226. Specifically, this light blocking coating is deposited or otherwise coated on the front side of the substrate 224.

In the preferred embodiment, a backside of the baffle substrate 224 is similarly coated with a light blocking coating 230, outside the region of the port 226. In the present invention, these light blocking coatings are a metal, which have been deposited on the baffle substrate 224, such that it is on the substrate, but does not cover the transmission port 226.

To provide further discrimination when the signal of interest is spectrally separated from the stray light, a dichroic coating 232 is preferably deposited on the baffle substrate 224 at least in the region of the transmission port 226. In one example, this dichroic coating is reflective to wavelengths at approximately 980 and/or 1480 nm, but broadly transmissive in wavelengths surrounding 1,550 nm, and specifically to wavelengths of approximately 1520 nm to 1630 nm, thus including the C and L bands.

A good dichroic coating can reflect greater than 99.5 percent of the 980 nm light and transmit 98.5% of the approximately 1,550 nm light of the optical signal.

In one example, a cap substrate 240 is provided. It is placed on the top of the detector system 128, 162, thus providing a block when the detector system is flipped and installed on the bench 100. This prevents light reflecting off lid 14 of the module 10 from being coupled through the side of the substrate 224 to enter the transmission port 226. This is especially important when the baffle substrate's light blocking coatings are reflective to the stray light.

Figure 3:
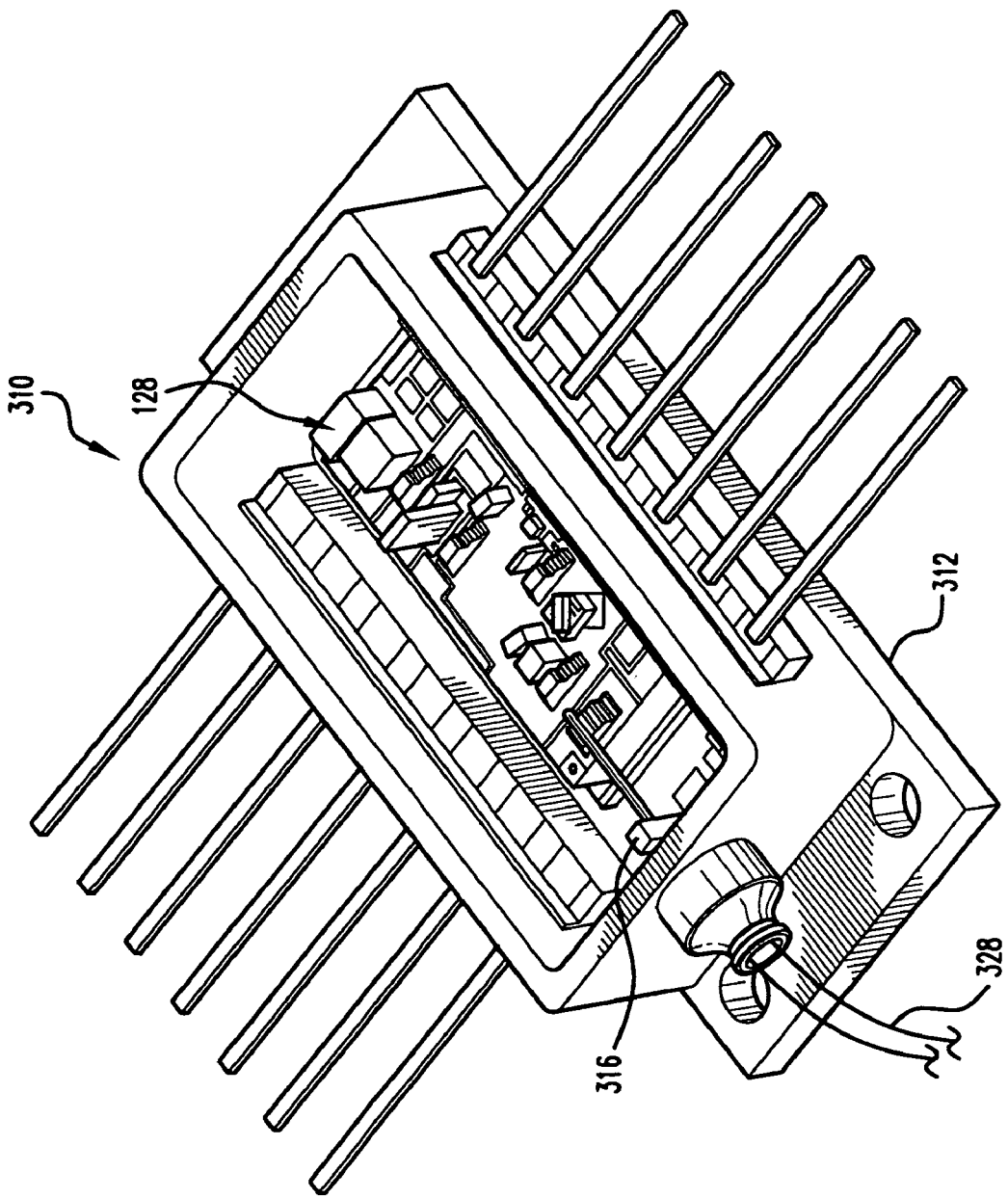
FIG. 3 is perspective view of a spectrometer with integrated reference source/tunable optical filter system, to which the principles of the present invention are applicable.

FIG. 3 shows a tunable optical filter system including the inventive detector system 128.

Specifically, the tunable optical filter system generally comprises a package 312 and an optical bench 314, which is sometimes referred to as a submount. The bench 314 is installed in the package, and specifically on a thermoelectric (TE) cooler 316, which is located between the bench 314 and the package 312, in the specific illustrated embodiment.

The package 312, in this illustrated example, is a butterfly package. The package's lid is shown removed in the illustration.

The optical system, which is installed on the top surface of the bench 14, generally comprises the detector system 128, a tunable filter system 322, a reference source system 324, and a signal source 326.

In more detail, the optical signal to be monitored is transmitted to the system 310 via a fiber pigtail 328, in the illustrated example. This pigtail 328 terminates at an endface 326 that is secured above the bench 314 using a fiber mounting structure 332 in the illustrated implementation. The optical signal passes through a first lens optical component 333 and a second lens optical component 334, which launches the optical signal into a tunable filter optical component 336. A MEMS implementation of the tunable filter is shown. The filtered signal passes through a third lens optical component 38 and is then detected by an optical signal detector 340.

In the illustrated implementation, each of the lens components comprises the optical element and a mounting structure that is used to secure the optical element to the bench, while enabling most installation alignment.

Turning to the path of the optical reference, the emission from a reference light source 342, such as a broadband source, e.g., a SLED on submount, passes through reference lens optical component 344 to a fixed filter 346, which, in the present implementation, is a Fabry-Perot etalon. It converts the broadband spectrum of the SLED 342 into a series of spectral peaks, corresponding to the various orders of the etalon, thereby producing the stable spectral features of the optical reference.

The optical reference is then reflected by fold mirror 48 to a dichroic or WDM filter 350, which is tuned to be reflective at the wavelength of the optical reference, but transmissive within the band of the optical signal. Thus, the optical reference is similarly directed to the optical filter system 322.

At the detector system 128, the optical signals are directed to pass through port 232 to the detector chip, not shown.

In this example, the use of the stray light insensitive detector system 128 facilitates the detection of the light from the reference source system 324 in the presence of stray signal light. This stray light is present because light that is not transmitted by the filter 336 is reflected, but largely not coupled back into the fiber 328. Thus, it is present in the package and can be detected when standard detectors are used, overwhelming the contribution from the reference sourc.

While this invention has been particularly shown and described with references to preferred embodiments thereof, it will be understood by those skilled in the art that various changes in form and details may be made therein without departing from the scope of the invention encompassed by the appended claims.

The invention claimed is:

1. A system comprising:
an optical bench on which an optical system is installed, the optical system include a stray light insensitive detector system comprising:
a detector chip which converts received light into an electrical signal;
a detector substrate on which the detector chip is mounted;
a baffle substrate positioned over the detector chip, the baffle substrate being non-transmissive and having a transmission port through which an optical signal is transmitted to the detector chip, the transmission port comprising a hole through the baffle substrate and extending parallel to a top surface of the optical bench to enable the detector chip to detect optical signals in the optical system; and
a spacer between the detector substrate and the baffle substrate to space the baffle substrate away from the detector chip, the spacer being annular shaped with the detector chip being installed within a center region of the spacer on the detector substrate, the spacer being installed on the optical bench to project vertically from the bench with an axis of the center region extending parallel to the surface of the bench;
wherein the optical signal propagates in free space above the optical bench before being directly received into the transmission port and propagating in free space through the port to the detector chip.

2. A system as claimed in claim 1, wherein the detector substrate comprises electrical traces to which the detector chip is electrically connected.

3. A system as claimed in claim 2, wherein the detector substrate comprises bond pads for wire bonding to make electrical connection to the electrical traces.

4. A system as claimed in claim 1, wherein the baffle substrate comprises a light blocking coating on at least one side of the substrate and outside of the transmission port.

5. A system as claimed in claim 1, wherein the baffle substrate comprises a light blocking coating on a front side and a back side of the baffle substrate and outside of the transmission port.

6. A system as claimed in claim 1, wherein the baffle substrate is absorbing to at wavelength of the stray light.

7. A system as claimed in claim 1, wherein the baffle substrate is coated to be reflective at a wavelength of the stray light.

8. A system as claimed in claim 1, further comprising a blocking cap substrate positioned over the baffle substrate to block stray light.

* * * * *